Figure 3:
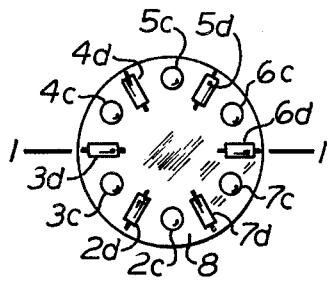

United States Patent [19]

Spiteri

[11] 4,166,242
[45] Aug. 28, 1979

[54] TRACTOR CABLE LIGHT CIRCUIT CHECKER

[76] Inventor: Joseph Spiteri, P.O. Box 71, Harborcreek, Pa. 16421

[21] Appl. No.: 623,582

[22] Filed: Oct. 20, 1975

[51] Int. Cl.² ............................................. G01R 31/02
[52] U.S. Cl. ........................................ 324/51; 324/133
[58] Field of Search ....................... 324/51, 66, 133, 52

[56] References Cited

U.S. PATENT DOCUMENTS

| | | | |
|---|---|---|---|
| 2,382,647 | 8/1945 | McLoughlin et al. | 324/52 |
| 2,610,237 | 9/1952 | Benner | 324/51 X |
| 2,956,229 | 10/1960 | Henel | 324/133 |
| 3,383,588 | 5/1968 | Stoll et al. | 324/51 |
| 3,428,888 | 2/1969 | Nolte | 324/51 |
| 3,663,939 | 5/1972 | Olsson | 324/51 |
| 3,737,767 | 6/1973 | Slutsky | 324/51 |
| 3,836,843 | 9/1974 | Yonce | 324/51 |
| 3,836,844 | 9/1974 | Prugh | 324/51 |
| 3,898,557 | 8/1975 | Strock | 324/51 |
| 3,904,758 | 9/1975 | Gartland et al. | 324/51 |
| 3,967,195 | 6/1976 | Averitt et al. | 324/133 X |
| 3,984,765 | 10/1976 | Rocci | 324/51 |

FOREIGN PATENT DOCUMENTS 2060884  6/1972  Fed. Rep. of Germany ........... 324/133

*Primary Examiner*—Gerard R. Strecker
*Attorney, Agent, or Firm*—Ralph Hammar

[57] ABSTRACT

A checker for the tractor cable which supplies power for semi trailer lights in which a light emitting diode indicates continuity. The checker is usable with positive and negative ground and in a preferred form also indicates polarity.

2 Claims, 11 Drawing Figures

TRACTOR CABLE LIGHT CIRCUIT CHECKER

The power supply for a semi trailer comes from the tractor through a cable having a socket into which a cable from the semi trailer is plugged. Before the tractor can be hooked up to the trailer, the tractor power supply must be checked. Heretofore this has been a two man job with the driver in the cab operating the controls and a mechanic measuring the voltages at the socket. This invention is a checker which turns this operation into a one man job. The driver plugs the checker into the socket and places the checker on the seat beside him or in any other position where it is visible. If any one of the diodes fails to light up when the switch for its circuit is closed, that particular circuit is faulty and must be corrected before the tractor can be connected to the semi trailer.

In the drawing

Figure 5:
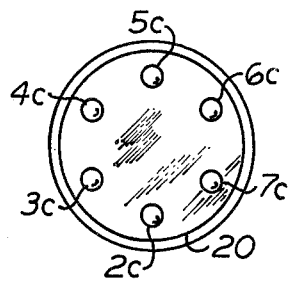
Figure 7:
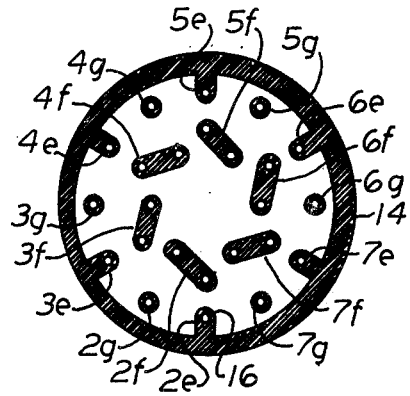
Figure 4:
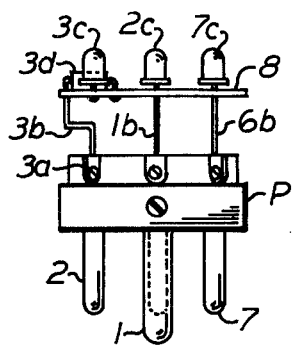
Figure 1:
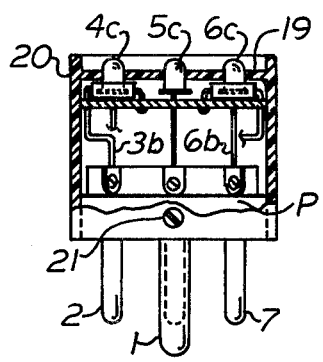
Figure 6:
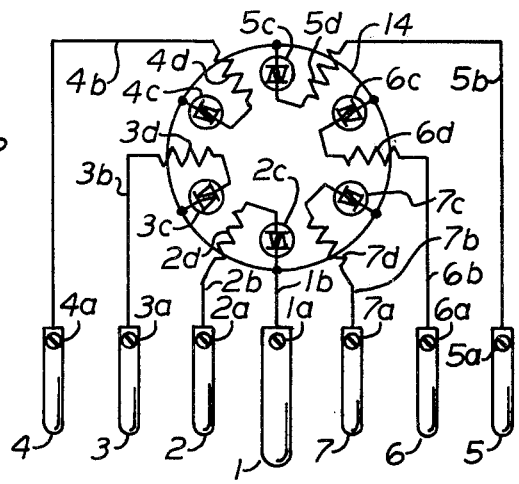
Figure 2:
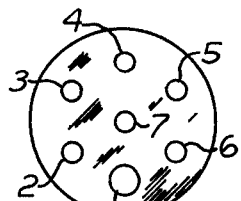
Figure 8:
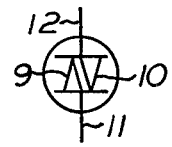
Figure 9:
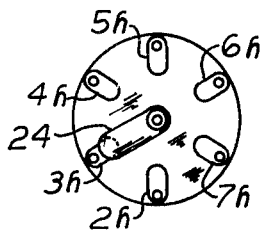
Figure 10:
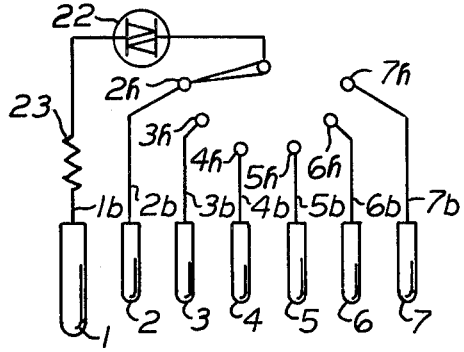
Figure 11:
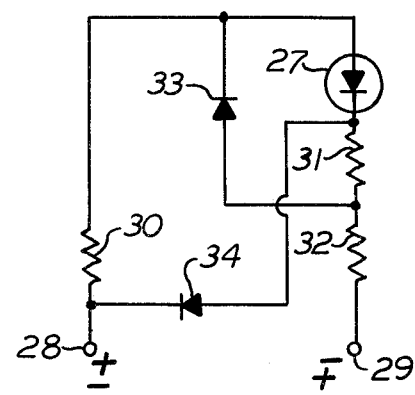

FIG. 1 is a section through a preferred form of checker taken on line 1—1 of FIG. 3, FIG. 2 is a bottom plan view of the checker unit, FIG. 3 is a top plan view of the checker unit, FIG. 4 is a side elevation of the checker unit and FIG. 5 is a top plan view of the housing into which the checker unit is assembled, FIG. 6 is a circuit diagram, FIG. 7 is an enlarged bottom plan view of the printed circuit board, shown in FIGS. 1,3 and 4, FIG. 8 is a diagram of one of the light emitting diodes, FIG. 9 is a plan view of a modification, FIG. 10 is a circuit diagram of the modification and FIG. 11 is a circuit diagram using a single light emitting diode which lights up under either positive or negative ground systems.

The checker uses the same plug P as the plug on the semi trailer cable. This plug has a common ground pin 1, a pin 2 for the identification clearance and side marker lights, a pin 3 for left hand turn signal, a pin 4 for stop lamps, a pin 5 for right hand turn signal, a pin 6 for the tail light and a pin 7 for supplying power to auxilliaries, if any. These pins are industry standard and are arranged as shown in FIG. 2. The ground pin is larger in diameter and longer than the other pins so that the plug can be inserted in the socket of the tractor power supply cable in only one way. It is necessary that the plug be standard in the trucking industry to permit any tractor to be connected to any trailer. Each of the pins 1 through 7 inclusive is bored in its upper end and provided with a screw $1a$–$7a$ for clamping a lead wire $1b$–$7b$ against the bore. In addition to making the electrical connections to the upper ends, the lead wires provide the sole mechanical support for a printed circuit board 8 on which the components for providing the indication are mounted. On the upper side of the printed circuit board are carried light emitting diodes $2c$–$7c$ and resistors $2d$–$7d$ inclusive, each producing an indicating circuit to ground for the correspondingly numbered pin.

The diodes (FIG. 8) preferably consist of chips 9,10 oppositely oriented, and connected in parallel to leads 11 and 12. The chip 9 which conducts when lead 11 is positive and lead 12 negative is preferably red and the chip 10 which conducts when the lead 12 is positive and the lead 11 negative is preferably green. This permits use of the checker for tractors with either positive or negative ground and the color of the light indicates the polarity of the ground for the particular tractor being checked.

The light emitting diodes $2c$–$7c$ and resistors $2d$–$7d$ are all mounted on top of the printed circuit board 8 and have leads extending through holes in the printed circuit board, each hole being surrounded by a connection pad for making soldered connections to the leads. The holes and the connection pads are shown in FIG. 7. At the outside of the board is metal rim 14 provided with connection pads $2e$–$7e$ for connecting each of the correspondingly numbered diodes to ground. The connection pad $2e$ also has a hole 16 for receiving and making the ground connection to the ground lead. The under side of the printed circuit board 8 also has connection pads $2f$–$7f$ for making connections between diodes $2e$–$7e$ and resistors $2d$–$7d$ and connection pads $2g$–$7g$ for receiving one of the leads from resistors $2d$–$7d$ which respectively constitute the leads $2b$–$7b$.

When the parts so far described are assembled, the device is as shown in FIG. 4 which is completely operative assembly. In FIG. 4, for clarity the leads $2b,4b,5b,$ and $6b$ have been omitted but it is thought that the structure will be clear. The pins 1–7 extend axially from one end of the checker, the diodes $2c$–$7c$ extend axially from the other end of the checker, the plug P and the printed circuit board 8 extend crosswise of the axis of the checker and the leads $1b$–$7b$ extend axially between the plug P and the printed circuit board 8.

The FIG. 4 structure is enclosed in a housing of impact resistant thermo plastic having a bore 18 in its lower end slidably receiving the plug P and the diodes and resistors carried thereby. In the upper end of the housing is an integral partition 19 having openings receiving the upper ends of the diodes $2c$–$7c$. The assembly is held within the housing by a set screw 21 which has the additional function of orienting the assembly with respect to the housing.

The structure of FIGS. 1–7 is preferred because it provides checking for trucks with either positive or negative ground and also indicates the polarity of the ground in the truck being checked. The electrical components have extremely long life and are protected from all normal impacts by the one piece housing. The plug P is a standard unit which can be replaced by loosening screws $1a$–$7a$. The extension 20 at the upper end of the housing protects the diodes $2e$–$7e$ and also acts as a sun shade.

From one aspect the light emitting diode of FIG. 8 is a self gated triac. When used on a.c., diode 9 lights during the half cycle when lead 11 is positive and diode 10 lights during the half cycle when lead 11 is negative. This provides continuous illumination at high efficiency and with essentially unlimited life. The diode is also extremely rugged and resistant to shocks, vibration and rough handling.

FIGS. 9 and 10 show an alternative structure which uses only a single light emitting diode and a selector switch. The plug P and the terminal pins 1 through 7 are identical. In place of the diodes $2c$–$7c$ and resistors $2d$–$7d$, a single diode 22 and a single resistor 23 are used. The diode and resistor are connected in series through lead $1b$ to the ground terminal 1. In the housing there is a selector switch 24 connectable to any one of the contacts $2h$–$7h$ which are respectively connected to with the pins 2–7. As the selector switch 24 makes contact with each contact $2h$–$7h$, the diode 22 lights up if the circuit is satisfactory. The diode 22 is of the same construction as the FIG. 7 diode, the checker of FIGS.

8 and 9 is usable with both positive and negative grounds and indicates the polarity of the ground in the tractor being checked.

FIG. 11 shows another structure for the checker usable with both positive and negative ground. In this circuit only one of the light emitting diodes 27 is shown. This diode is connected in the circuit so that when terminal 28 is positive and terminal 29 is ground current flows through resistor 30 diode 27 and resistors 31 and 32. When terminal 29 is positive and terminal 28 is ground current flows through resistor 32 diode 33 light emitting diode 27 and diode 34. This structure is adapted to FIGS. 1-7 and FIGS. 9,10 checkers.

What is claimed:

1. A checker for the circuits of a tractor cable for supplying power to a semi trailer, said tractor cable having a socket for receiving the plug of a semi trailer cable, said checker comprising a plug having a common ground pin and live pins insulated from each other and extending axially from the plug and corresponding respectively in size and orientation to the ground and live pins of the plug of a semi trailer cable, a printed circuit board axially spaced from and extending crosswise of the axis of said plug and having a common ground circuit and a plurality of indicating circuits thereon, one indicating circuit for each live pin, a lead extending axially from the common ground pin through a hole in the printed board circuit to said common ground circuit, each indicating circuit having a light emitting diode and a resistor connected in series and mounted on top of the printed circuit board with leads extending through holes in the printed circuit board and with each hole being surrounded by a connection pad for making a soldered connection to the leads, one lead of each resistor having one end mechanically and electrically connected to its respective pin and the other end mechanically connected to the printed circuit board and electrically connected to a lead of its corresponding light emitting diode, said leads providing the mechanical support for the printed circuit board, the other lead of each diode being connected to said ground circuit, and the parts so far claimed being a completely operative assembly.

2. The checker of claim 1 in which the indicating circuits each include an envelope containing two light emitting diodes, a connection from the lead from the live pin to the positive terminal of one diode and to the negative terminal of the other diode, and a connection from the ground pin to the negative terminal of said one diode and to the positive terminal of said other diode so said one diode lights when ground is negative and said other diode lights when ground is positive.

* * * * *